(12) United States Patent
Bergogne

(10) Patent No.: US 10,886,917 B2
(45) Date of Patent: Jan. 5, 2021

(54) POWER TRANSISTOR CONTROL CIRCUIT

(71) Applicant: Commissariat à l'Energie Atomique et aux Energies Alternatives, Paris (FR)

(72) Inventor: Dominique Bergogne, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/692,001

(22) Filed: Nov. 22, 2019

(65) Prior Publication Data

US 2020/0169254 A1    May 28, 2020

(30) Foreign Application Priority Data

Nov. 23, 2018 (FR) ...................... 18 71796

(51) Int. Cl.
| H02M 1/08 | (2006.01) |
| H02M 7/5387 | (2007.01) |
| H02M 7/5388 | (2007.01) |
| H02M 7/5395 | (2006.01) |
| H02M 7/539 | (2006.01) |
| H03K 17/687 | (2006.01) |

(52) U.S. Cl.
CPC . *H03K 17/6871* (2013.01); *H03K 2217/0063* (2013.01)

(58) Field of Classification Search
CPC ............... H02M 1/08; H02M 1/088; H02M 7/5387–5395; H03K 2217/0063; H03K 2217/0072; H03K 17/6871
See application file for complete search history.

(56) References Cited

U.S. PATENT DOCUMENTS

| 2003/0210081 A1* | 11/2003 | Watabe ............... H03K 17/567 327/108 |
| 2016/0065205 A1* | 3/2016 | Niikura ............... H03K 17/687 318/504 |
| 2017/0187373 A1* | 6/2017 | Bergogne .......... H03K 17/6871 |

(Continued)

OTHER PUBLICATIONS

J. Wittmann et al., "A 50V High-Speed Level Shifter with High dv/dt Immunity for Multi-MHz DCDC Converters," IEEE Proceedings of the ESSCIRC, Sep. 22, 2014, pp. 151-154.

(Continued)

*Primary Examiner* — Thienvu V Tran
*Assistant Examiner* — Sisay G Tiku
(74) *Attorney, Agent, or Firm* — Moreno IP Law LLC

(57) ABSTRACT

The present invention concerns a circuit for converting a first control signal referenced to a first potential into a second signal referenced to a second variable potential, including: a first transistor between a first terminal for supplying said second signal and a second terminal at said second variable potential; and at least one first branch including, in series between a gate of the first transistor and a third terminal at said first potential, a second transistor, a first resistive element, and a third transistor, a gate of the third transistor being intended to receive the first signal and a gate of the second transistor being coupled to the second terminal, the gate of the second transistor being further coupled, by a first clipping element, to its source.

12 Claims, 2 Drawing Sheets

(56) References Cited

U.S. PATENT DOCUMENTS

2018/0109251 A1* 4/2018 Djelassi ............... H03K 3/3565
2020/0162074 A1* 5/2020 Niikura ............... H03K 17/687

OTHER PUBLICATIONS

S. Finco et al., "Power Integrated Circuit Drives Based on HV NMOS," Power Electronics Specialists Conference, vol. 4, Jun. 23, 2002, pp. 1737-1740.

Preliminary Search Report for French Application No. 1871796 dated Jul. 25, 2019, 1 page.

* cited by examiner

POWER TRANSISTOR CONTROL CIRCUIT

FIELD

The present disclosure generally concerns electronic circuits and, more particularly, techniques for bootstrapping switches made in high-voltage technology. The present disclosure more particularly concerns the driving of the switches of an inverter arm.

BACKGROUND

In recent technologies, current or voltage inverters are particularly based on the use of power transistors arranged in series between terminals of application of a voltage or current source and are independently controlled. Such a control conventionally requires using drivers of these transistors based on variable or floating potentials. This generally results in providing galvanic isolation elements, which increases the cost of the solution.

Document "A 50V High-Speed Level Shifter with High dv/dt Immunity for Multi-MHz DCDC Converters" of J. Wittmann et al. (IEEE, Sep. 22, 2014, pages 151-154, XP032672078) describes, in relation with its FIGS. 3(a) and 3(b) two different versions of level-shifter circuits, respectively with a diode and with a cascode-assembled PMOS transistor.

Document "Power Integrated Circuit Drives Based on HV NMOS" of S. Finco et al. (Annual Power Electronics Specialists Conference, Jun. 23, 2002, pages 1737-1740, XP010596000) describes level-shifter circuits based on NMOS transistors.

SUMMARY

There is a need to improve power switch control circuits, in particular in applications to inverters.

An embodiment overcomes all or part of the disadvantages of drivers of power switches in series.

An embodiment provides a particularly simple solution.

An embodiment provides a solution particularly adapted to N-channel transistors in applications where the voltage applied to the drain of the transistors is much greater than their gate voltage.

An embodiment provides a circuit for converting a first control signal, referenced to a first potential, into a second signal referenced to a second variable potential, comprising:
  a first transistor between a first terminal for supplying said second signal and a second terminal at said second variable potential; and
  at least a first branch comprising, in series between a gate of the first transistor and a third terminal at said first potential, a second transistor, a first resistive element, and a third transistor, a gate of the third transistor being intended to receive the first signal and a gate of the second transistor being coupled to the second terminal, the gate of the second transistor being further coupled, by a first clipping element, to its source,
  the gate of the first transistor being coupled, by a second resistive element, to a third terminal at a third potential, greater than the second potential.

According to an embodiment, said clipping element forces a turning on of the second transistor when the third transistor is turned on.

According to an embodiment, the first branch is active when the second variable potential is greater than the first potential.

According to an embodiment, the first transistor is turned on when the first signal is in a state making the third transistor non-conductive.

According to an embodiment, the circuit further comprises a second branch in parallel with the first branch, between the gate of the first transistor and the third terminal.

According to an embodiment, the second branch is intended to be active when the second variable potential is substantially equal to the first potential.

According to an embodiment, the second branch comprises, in series between the gate of the first transistor and the third terminal, a fourth transistor, a second clipping element, a diode, and a fifth transistor, a gate of the fifth transistor being intended to receive the inverse of the first signal and a source of the fourth transistor being coupled to the second terminal, the gate of the fourth transistor being further coupled to the junction point of the second clipping element and of the diode.

According to an embodiment, the second branch has a structure similar to that of the first branch, while being controlled by the inverse of the first signal.

According to an embodiment, the transistors are N-channel MOS transistors.

An embodiment provides an inverter arm comprising:
  a first switch and a second switch in series between a first terminal and a second terminal of application of a first voltage;
  a conversion circuit, the second terminal at the variable potential representing the junction point of the two switches.

According to an embodiment, the second signal is intended to control the first switch.

According to an embodiment, the amplitude of the first voltage is greater, by a ratio of at least ten, than the amplitude of the first control signal.

The foregoing and other features and advantages will be discussed in detail in the following non-limiting description of specific embodiments in connection with the accompanying drawings.

DETAILED DESCRIPTION OF THE PRESENT EMBODIMENTS

Figure 1:
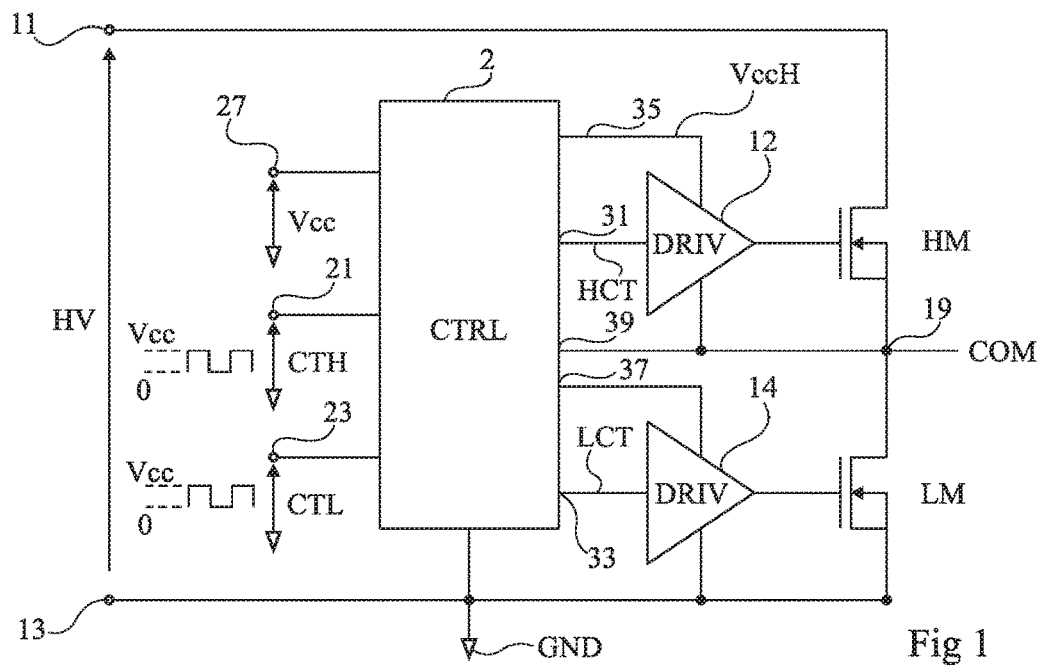
FIG. 1 very schematically shows, in the form of blocks, an example of an inverter arm of the type to which the embodiments which will be described apply.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the generation of the pulse frequency or width modulation control signals for controlling the power switches has not been detailed, the described embodiments being compatible with usual techniques for generating such signals. Similarly, the use of the power transferred by the power switches which are controlled by the described circuits has not been detailed, the described embodiments being here again compatible with current uses.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

FIG. 1 very schematically shows, in the form of blocks, an example of an inverter arm of the type to which the embodiments which will be described apply.

An inverter arm is based on two power switches HM and LM, typically voltage-controlled transistors (MOS transistors, IGBT transistors, SiC transistor, GaN HEMT, etc.), in series between two terminals 11 and 13 of application of a voltage HV, typically a DC voltage, referenced to a ground GND. The potential of terminal 11 is thus a potential HV while the potential of terminal 13 is 0 volt. The junction point (terminal 19) of the two switches HM and LM forms the output of the arm, which is at a potential varying between the potentials of terminals 11 and 13. The term power transistor designates transistors having a gate voltage much smaller (by a ratio of at least 10 and most often of at least 100) than the voltage present on the drain of the transistor.

Usually, the term voltage is used to define a potential difference between two terminals and the term potential is used to define an absolute level, that is, relative to ground or 0 volt.

Transistors HM and LM are, in the shown example, power transistors having their respective sources coupled to terminals 19 and 13. The respective gates of transistors HM and LM receive signals for controlling (in all or nothing) circuits or amplifiers (drivers) 12 and 14 (DRIV). The gate control signals of transistors HM and LM are generated to avoid a simultaneous conduction of the two transistors, which would short-circuit input terminals 11 and 13. Circuits 12 and 14 each receive a control signal HCT, respectively LCT, from a control circuit 2 (CTRL). Typically, each circuit 12, 14 comprises a structure of two switches in series having their junction point delivering the gate control signal of the corresponding transistor HM, LM and having their gates receiving information representative of signal HCT, respectively LCT. This is an example only and the described embodiments more generally apply to any usual driver circuit structure.

In the example of FIG. 1, where transistors HM and LM are N-channel transistors, the output signals of circuits 12 and 14 should be respectively referenced to potential COM of terminal 19 (for circuit 12) and to potential GND of terminal 13 (for circuit 14).

For this purpose, control circuit 2 (CTRL) having the function of supplying circuits 12 and 14 not only with properly referenced control signals HCT and LCT, but also with also properly referenced power supply voltages compatible with the (low) voltage that such circuits can withstand, is provided.

Circuit 2 is powered with a low DC voltage Vcc applied between a terminal 27 and terminal 13, that is, referenced to ground GND (the potential of terminal 27 is Vcc) and receives, on terminals 21 and 23, digital set point signals CTH and CTL for respective controlling transistors HM and LM. Signals CTH and CTL are pulse-width and/or frequency modulated digital signals between potentials respectively equal to Vcc and to 0.

For simplification, voltage drops in switch-type components in the on state are neglected in the present disclosure. For example, reference is made to signals CTH and CTL switching between 0 and Vcc while in reality, these levels are shifted by a few hundreds of millivolts by the on-state resistors of the circuits generating them. Signals CTH and CTL are delivered by upstream digital circuits which modulate the pulse width and/or the frequency of the pulse trains of signals CTH and CTL according to the application.

In the embodiment illustrated in FIG. 1, circuit 2 delivers on terminals 31 and 33 signals HCT and LCT, which have an amplitude close to Vcc but are respectively referenced to potentials COM and GND. Circuit 2 also delivers, between a terminal 35 and a terminal 39 coupled, preferably connected, to terminal 19, a low DC power supply voltage VccH of circuit 12 (typically with an amplitude approximately equal to voltage Vcc). Circuit 2 further delivers, between a terminal 37 and terminal 13, a low power supply voltage of circuit 14 (typically having a value approximately equal to Vcc) referenced to ground GND.

Circuit 14, associated with transistor LM, may be directly controlled by signal CTL (LCT=CTL) since it has a reference potential (ground GND) common with the signal. Thus, circuit 14 may be directly powered with voltage Vcc referenced to ground GND (terminal 13). Terminal 23 is then coupled, preferably connected, to terminal 37. However, on the side of circuit 12, potential COM of terminal 39 varies, neglecting voltage drops in transistors HM and LM in the on state, between ground 13 (transistor LM on) and the potential of terminal 11, that is, the high potential of voltage HV (transistor HM on). Circuit 2 should thus transpose signal CTH, switching between potentials 0 and Vcc, into a signal HCT switching between potentials COM and COM+Vcc. Further, potential COM varies between 0 (transistor LM on) and HV (transistor HM on).

Voltage HV is further generally greater than the voltage that the logic circuits and amplifiers 12 and 14 can withstand. Typically, in so-called power applications, voltage HV is at least 10 times greater (generally in the order of 100 times greater) than voltage Vcc, which corresponds to the voltage of the logic circuits. To take a randomly selected specific example, the case of a voltage HV in the order of 400-500 volts and a voltage Vcc in the order of 4-6 volts can be considered.

Conventionally, to solve the problem of voltage reference of the high stage (circuit 12), a galvanic isolation element of transformer or optocoupler type having the function of operating as a level shifter to shift the level of signal CTH is used. Such galvanic isolation elements are however not integrable, including in currently available technologies where low-voltage components and high-voltage components may be integrated on a same chip.

The obtaining of the low power supply voltage of circuit 12 (between terminals 35 and 39) from voltage Vcc referenced to ground is less of an issue since it can be obtained by means of an assembly generally called bootstrap assembly. Such an assembly, based on a high-voltage diode between terminals 27 and 35 and a capacitor between terminals 35 and 39, is integrable in a high-voltage technology.

Figure 2:
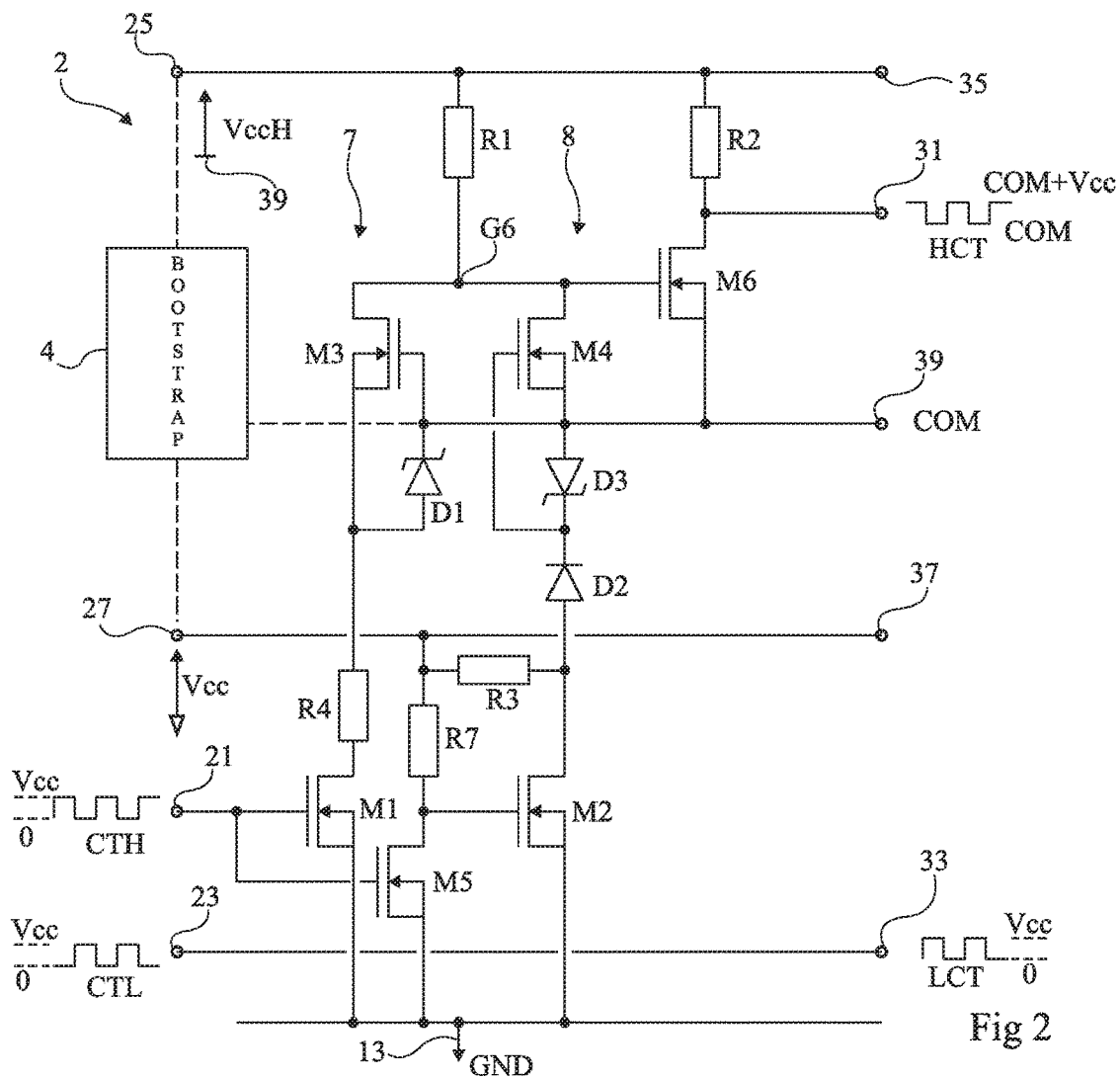
FIG. 2 shows the electric diagram of an embodiment of a circuit for transforming signals for controlling and powering drivers of an inverter arm.

FIG. 2 shows the electric diagram of an embodiment of a circuit for transforming signals of control and power supply of driver stages of an inverter arm.

Circuit 2 of FIG. 2 comprises three input terminals 27, 21, and 23, respectively of application of a DC power supply voltage Vcc referenced to ground and of control signals CTH and CTL, also referenced to ground GND. All the signals are low-voltage signals (typically below approximately 10 volts, preferably in the order of from 4 to 6 volts).

Circuit 2 further comprises a terminal 39 intended to be coupled, preferably connected, to terminal 19 (junction point of transistors HM and LM) and two terminals 35 and 37 for delivering high potentials of power supply voltages of circuits 12 and 14, the respective low potentials corresponding to the potentials of terminals 39 and 13. Preferably, the voltage VccH delivered between terminals 35 and 39 and the voltage Vcc delivered between terminals 37 and 13 are of same amplitude but are respectively referenced to potentials COM and GND of terminals 39 and 13. Two output terminals 31 and 33 of circuit 2 are intended to deliver control signals HCT and LCT to circuits 12 and 14, respectively referenced to the potentials of terminals 39 and 13. In other words, signals HCT and LCT respectively vary between the potentials of terminals 35 and 39 and between the potentials of terminals 37 and 13.

In the example of FIG. 2, it is assumed that voltage VccH, having an amplitude Vcc referenced to terminal 39, is delivered, from voltage Vcc, by a bootstrap-type assembly 4 (BOOTSTRAP) different from circuit 2. Voltage VccH is then applied to a terminal 25 coupled, preferably connected, to terminal 35. However, circuit 4 may be integrated to circuit 2. An example of a bootstrap-type assembly will be illustrated hereafter in relation with FIG. 4.

Preferably, circuit 14 is directly powered by voltage Vcc referenced to ground and is directly controlled by signal CTL. Thus, terminal 37 is coupled, preferably connected, to terminal 21, and terminal 33 is coupled, preferably connected, to terminal 23.

According to the described embodiments, it is provided to deliver high signal HCT via a transistor M6, preferably an N-channel transistor, coupling terminals 31 and 39. Terminal 31 is further coupled, by a resistive element R2, to terminal 35. When transistor M6 is off, terminal 31 is pulled to the potential of terminal 39 by resistive element R2 (pull-up function). When transistor M6 is on, terminal 31 is forced to the potential of terminal 39. Gate G6 of transistor M6 is coupled to terminal 35 by a resistive element R1. In the idle state, the gate of transistor M6 is accordingly pulled to the potential of terminal 35. In the idle state, transistor M6 is thus on and signal HCT is thus in the low state (potential COM of terminal 39).

The control of transistor M6, from signal CTH (which is referenced to ground), is performed by means of two parallel branches 7 and 8, between gate G6 of transistor M6 and the ground (terminal 13), respectively enabling to draw a current onto terminal 35 when terminal 39 is at a high potential or to inject a current when terminal 39 is at a low potential. In practice, the high potential COM is potential HV (transistor HM on) and the low potential COM is ground GND (transistor LM on). However, the notions of "high" and "low" are conditioned by the components which are described hereafter. The function of branches 7 and 8 is, when signal CTH is active (high state Vcc), to block transistor M6 and to thus take signal HCT to the high state (potential COM+Vcc of terminal 35).

Branch 7 comprises, in series between gate or node G6 and terminal 13, a transistor M3, a resistor R4, and a transistor M1. Transistors M1 and M3 are preferably N-channel MOS transistors. The gate of transistor M1 is coupled, preferably connected, to terminal 21 and thus receives signal CTH. The gate of transistor M3 is coupled, preferably connected, to terminal 39. Further, the gate of transistor M3 is coupled to its source (and thus to resistor R4) by an avalanche diode D1 (typically a zener diode) or a clipping element. The anode of diode D1 is on the source side of transistor M3. The source of transistor M1 is coupled, preferably connected, to terminal 13.

Branch 8 comprises, in series between gate or node G6 and terminal 13, a transistor M4, a clipping element (for example, a zener diode D3), a diode D2, and a transistor M2. Transistors M2 and M4 are preferably N-channel transistors. The junction point of transistor M4 and diode D3 is coupled, preferably connected, to terminal 39 (the source of transistor M4 and the anode of diode D3 are thus connected to terminal 39). The anode of diode D2 is on the side of transistor M2 having its source coupled, preferably connected, to terminal 13. The gate of transistor M2 is coupled, by an inverter assembly, to terminal 21 to receive the inverse of signal CTH. For example, the gate of transistor M2 is coupled to terminal 37 by a resistive element R7 and is coupled to terminal 13 by a transistor M5, preferably an N-channel transistor. The gate of transistor M5 is coupled, preferably connected, to terminal 21. The source of transistor M5 is coupled, preferably connected, to terminal 13. Finally, a resistor R3 pulls the drain of transistor M2 in the off state to potential Vcc and is used to bias diode D2.

Transistor M1 is on when signal CTH is in the high state and transistor M2 is on when signal CTH is in the low state (when transistor M5 is off).

Transistor M3 of branch 7 operates with a common gate. Accordingly, when transistor M1 is turned on and the level of potential COM is high (in the order of HV), the source of transistor M3 takes a potential smaller than that of its gate, which turns it on. The gate-source voltage drop is limited by diode D1 (for example, to in the order of from 4 to 10 volts) to protect transistor M3. A current then flows through branch 7 by being drawn onto terminal 35, which turns off transistor M6. Resistor R4 is used as a current limiter. It for example has a value of a few tens of kiloohms. Resistor R4 may be replaced with a circuit with current-limiting transistors. If the potential of terminal 39 is too low (in the order of 0 V), the gate of transistor M3 remains at too low a potential for transistor M3 to be turned on when its source is approximately at 0 (transistor M1 on). When transistor M1 is off (signal CTH in the idle state), the source of transistor M3 is floating and the latter is thus off.

Transistor M4 of branch 8 operates with a common source. In the idle state (signal CTH in the low state), transistor M5 is off and transistor M2 is on. Accordingly, diode D2 is off and transistor M4 is thus also off whatever the variation of potential COM between 0 V and HV. When signal CTH is in the high state, transistor M5 is turned on, which turns off transistor M2. Diode D2 is then forward biased by resistor R3. If potential COM is sufficiently low, the gate-source voltage of transistor M4 becomes sufficient to turn it on and a current is then drawn from terminal 35 to turn off transistor M6. Diode D3 is used as a protection diode during transients on terminal 39 (during switchings of transistors HM and LM).

It should be noted that resistor R4, transistor M1, and diode D2 should be sized to withstand the high voltage HV imposed between terminals 39 and 13 when power switch HM (FIG. 1) is on. Resistor R4 and diode D2 are used to transmit the information contained in signal CTH.

All the other components of the assembly of FIG. 2 (except for bootstrap circuit 4) are low-voltage components.

According to an alternative embodiment, the two branches are in the form of branch 7, that is, diodes D2 and D3 and transistor M4 of branch 8 are replaced with a transistor (assembled like transistor M3), a clipping element (assembled like clipping element D1), and a resistive element (assembled like resistive element R4) between gate G6 and the drain of transistor M2. The operation is similar to that described in relation with FIG. 2 for branch 7, but with states inverse to those of signal CTH. This variation requires for transistor M2 to be a high-voltage transistor and it should be ascertained that switchings are sufficiently fast for the two transistors (M3) connected to gate G6 not to conduct simultaneously.

Figure 3:
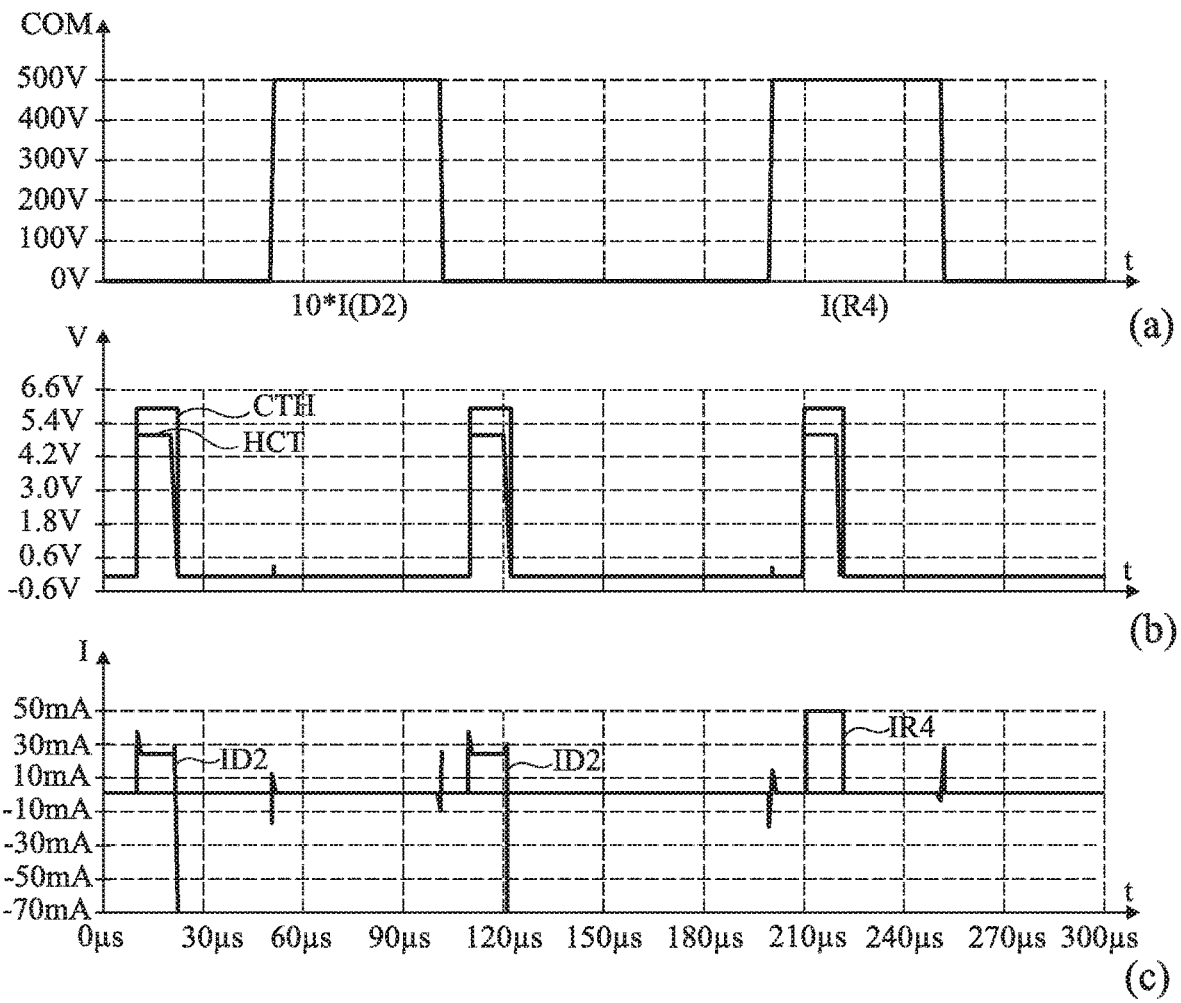
FIG. 3 illustrates in timing diagrams the operation of the circuit of FIG. 2.

FIG. 3 illustrates in timing diagrams the operation of the circuit of FIG. 2. FIG. 3(a) shows an example of shape of signal CTH and the corresponding shape of signal HCT. FIG. 3(b) illustrates an example of shape of potential COM. FIG. 3(c) illustrates the corresponding shapes of currents ID2 through diode D2 and IR4 through resistor R4.

It can be seen that, when the voltage of terminal 35 referenced to ground (potential COM) is high, the active branch is branch 7 of resistor R4. However, when potential COM is zero, the active branch is branch 8 of diode D2.

Figure 4:
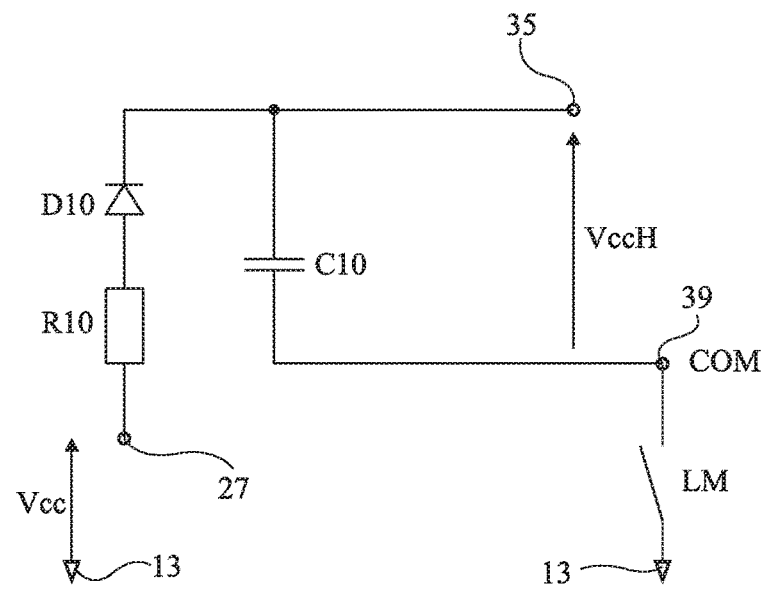
FIG. 4 shows in simplified fashion an embodiment of a bootstrap assembly.

FIG. 4 very schematically shows an example of a bootstrap assembly that can be used to deliver voltage VccH.

For simplification, only the elements involved in the operation of bootstrap assembly 4 have been shown in FIG. 4.

Assembly 4 comprises, between terminal 27 of application of voltage Vcc (referenced to ground 13) and terminal 35, a resistor R10 in series with a diode D10, the cathode of diode D10 being on the side of terminal 35. Terminal 35 is further coupled, by a capacitor C10, to terminal 39. When switch LM is turned on, voltage Vcc charges, positively with respect to terminal 39, capacitor C10 and thus creates an auxiliary voltage supply VccH, referenced to terminal 39, for circuit 12. Diode D10, conditioning the flow direction from terminal 27 to capacitor C10, avoids for capacitor C10 to discharge otherwise than so as to power circuit 12. Resistor R10 is used to limit inrush currents during the recharge of capacitor C10. Diode D10 is a high-voltage diode since it should withstand voltage VH+VccH when transistor LM is off.

The assembly of FIG. 4 is an example only and any other assembly capable of delivering an amplitude voltage Vcc between terminals 25 and 39 may be used.

An advantage of the described embodiments is that they avoid the use of galvanic isolation means.

Another advantage of the described embodiments is that they only use integrable components.

Such embodiments are particularly advantageous for an integrated implementation in a technology enabling to arrange high-voltage and low-voltage transistors on a same chip. In such a context, the suppressing of a galvanic isolation element of transformer or optocoupler type is particularly advantageous.

The different resistive elements R1, R2, R3, R4, R7, and R10 may be formed of resistors or of normally-on transistors, for example, depletion N-channel transistors. Resistors R1, R2, R3, R7, and R10 for example have values in the order of one kiloohm.

High-voltage resistor R4 may for example be formed of a high-mobility transistor in GaN technology, generally designated as HEMTS. Similarly, diode D1 may advantageously be formed based on clamp-assembled normally-on HEMTs (High Electron Mobility Transistor).

Transistors M1, M2, M3, M4, M5, and M6 are preferably all normally-off transistors, for example, N-channel enhancement transistors.

Diode D2 is for example a Schottky diode or a reverse-assembled off transistor.

An inverter or switching arm such as illustrated in FIG. 2 may be used in any inverter, be it a current inverter or a voltage inverter, and more generally in any structure where a power switch should be controlled by having one of its terminals at a floating potential with respect to the potentials of a (digital) control signal.

For example, in the case of a three-phase current inverter, three arms of the type shown in FIG. 1 are associated in parallel and the respective midpoints of the arms define the three AC current phases. The power switches are controlled so that at each cycle, a high switch of an arm is on with a low switch of another arm to divide a DC current into three AC currents on the respective midpoints of the different arms. In practice, in a current inverter, a diode is generally provided in series with each switch HM, LM, to make it unidirectional for the current.

Various embodiments and variations have been described. It will be understood by those skilled in the art that certain features of these various embodiments and variations may be combined, and other variations will occur to those skilled in the art. In particular, although reference has been made to a current inverter arm, the described embodiments easily transpose to a driver of a high-voltage transistor, for which the level of a low-voltage control signal is desired to be shifted. Further, it may also be provided, in applications where the floating reference potential COM of the high stage remains greater than the reference potential GND of the low-voltage set point signal, to only provide branch 7. Further, although the described embodiments are particularly well adapted to an implementation based on N-channel transistors, they transpose to implementations based on P-channel transistors.

Finally, the practical implementation of the described embodiments and variations is within the abilities of those skilled in the art based on the functional indications given hereabove, in particular as for the values to be given to the resistive elements, to the diodes.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for converting a first control signal (CTH) referenced to a first potential (GND) into a second signal (HCT) referenced to a second variable potential (COM), comprising:
 a first transistor (M6) between a first terminal (31) for supplying said second signal (HCT) and a second terminal (39) at said second variable potential; and
 at least one first branch (7) comprising, in series between a gate (G6) of the first transistor (M6) and a third terminal (13) at said first potential (GND), a second transistor (M3), a first resistive element (R4), and a third transistor (M1), a gate of the third transistor (M1) being intended to receive the first signal (CTH) and a gate of the second transistor (M3) being coupled to the second terminal (39), the gate of the second transistor (M3) being further coupled, by a first clipping element (D1), to its source, the gate (G6) of the first transistor (M6) being coupled, by a second resistive element (R1), to a third terminal (35) at a third potential (HV), greater than the second potential (COM).

2. The circuit of claim 1, wherein said clipping element (D1) forces a turning on of the second transistor (M3) when the third transistor (M1) is turned on.

3. The circuit of claim 1, wherein the at least one first branch (7) is active when the second variable potential (COM) is greater than the first potential (GND).

4. The circuit of claim 1, wherein the first transistor (M6) is turned on when the first signal (CTH) is in a state turning off the third transistor.

5. The circuit of claim 1, further comprising a second branch (8) in parallel with the at least one first branch (7), between the gate (G6) of the first transistor (M6) and the third terminal (13).

6. The circuit of claim 5, wherein the second branch (8) is intended to be active when the second variable potential (COM) is substantially equal to the first potential (GND).

7. The circuit of claim 5, wherein the second branch (8) comprises, in series between the gate (36) of the first transistor (M6) and the third terminal (13), a fourth transistor (M4), a second clipping element (D3), a diode (02), and a fifth transistor (M2), a gate of the fifth transistor (M2) being intended to receive the inverse of the first signal (CTH) and a source of the fourth transistor (M4) being coupled to the second terminal (39), a gate of the fourth transistor (M4) being further coupled to a junction point of the second clipping element (D3) and of the diode (02).

8. The circuit of claim 5, wherein the second branch (8) has a structure similar to that of the at least one first branch (7), while being controlled by the inverse of the first signal.

9. The circuit of claim 1, wherein the transistors are N-channel MOS transistors.

10. An inverter arm comprising: a first switch (HM) and a second switch (LM) in series between a first terminal (11) and a second terminal (13) of application of a first voltage (HV); the circuit (2) of claim the second terminal (39) at the variable potential (COM) representing a junction point of the two switches.

11. The inverter arm of claim 10, wherein the second signal (HCT) is intended to control the first switch (HM).

12. The inverter arm of claim 10, wherein the amplitude of the first voltage (HV) is greater, by a ratio of at least ten, than an amplitude of the first control signal (CTH).

* * * * *